United States Patent
Al-Shamma et al.

(10) Patent No.: US 6,396,749 B2
(45) Date of Patent: May 28, 2002

(54) DUAL-PORTED CAMS FOR A SIMULTANEOUS OPERATION FLASH MEMORY

(75) Inventors: Ali Al-Shamma, San Jose; Lee Cleveland, Santa Clara, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/829,657

(22) Filed: Apr. 10, 2001

Related U.S. Application Data
(60) Provisional application No. 60/208,449, filed on May 31, 2000.

(51) Int. Cl.[7] .............................................. G11C 7/00
(52) U.S. Cl. ..................... 365/200; 365/49; 365/189.04
(58) Field of Search ..................... 365/200, 49, 185.99, 365/189.04, 230.05

(56) References Cited

U.S. PATENT DOCUMENTS 5,579,265 A * 11/1996 Devin ........................ 365/200
6,307,787 B1 * 10/2001 Al-Shamma et al. ....... 365/200
6,317,349 B1 * 11/2001 Wong ........................... 365/49

* cited by examiner

*Primary Examiner*—Tan T. Nguyen
(74) *Attorney, Agent, or Firm*—Wagner, Murabito & Hao LLP (57) ABSTRACT

A flash memory having redundancy content addressable memory (CAM) circuitry is described. The flash memory is capable of substituting a second memory cell for an inoperative memory cell. The flash memory includes a primary array of memory cells, a redundant array of memory cells, and the redundancy CAM circuitry. The redundancy CAM circuitry includes a plurality of dual-ported CAM stages. Each CAM stage includes a CAM cell, a write data bus coupled to the CAM cell, and a read data bus coupled to the CAM cell. The CAM cell stores information regarding a location of an inoperative memory cell in the primary array. The inoperative memory cell requires a substitution with a second memory cell in the redundant array. The write data bus produces the information from the CAM cell responsively to a write select signal. The write select signal is indicative of a write operation to be performed at memory cell locations in the primary array. The read data bus produces the information from the CAM cell responsively to a read select signal. The read select signal is indicative of a read operation to be performed at memory cell locations in the primary array.

30 Claims, 6 Drawing Sheets

DUAL-PORTED CAMS FOR A SIMULTANEOUS OPERATION FLASH MEMORY

This application claims benefits of provisional No. 60/208,449 file May 31, 2000.

BACKGROUND

The present invention relates generally to semiconductor memory devices. More particularly, the present invention relates to dual-ported content addressable memories for a simultaneous operation flash memory.

Flash random access memory (RAM), more commonly known as flash memory, is a form of non-volatile storage that uses a memory cell design with a floating gate. High voltages are applied to the memory cell inputs to program or store charge on the floating gate or to erase or remove charge from the floating gate. Programming occurs by hot electron transfer to place charge on the floating gate while erasure makes use of Fowler-Nordheim tunneling in which electrons pierce a thin dielectric material, reducing the amount of electronic charge on the floating gate. Erasing a cell sets the logical value of the cell to "1" while programming the cell sets the logical value to "0". Aside from programming or erasing operations, a flash memory operates similarly to a randomly accessible read only memory (ROM). Conventionally, a flash memory chip, including the flash memory storage cells and support logic/circuitry, is made by fabricating layers of semiconductor material and interconnect layers of polysilicon and first and second metal layers onto a substrate. It will be appreciated that there are numerous integrated circuit fabrication techniques, involving more or fewer layers, which are applicable herein.

Redundant core cell arrays are utilized to substitute for inoperative memory core cells of primary or regular arrays. Content addressable memory (CAM) circuitry may be utilized to assist in redundancy substitution. Redundancy CAM cells store information regarding the locations of inoperative memory cells so that redundant arrays of memory cells may be used to substitute for the inoperative memory cells of the primary arrays.

Typically, the arrays of memory cells are tested by the manufacturer for performance and accuracy prior to utilization by a customer or user. The redundancy CAM cells are erased and programmed with the locations of inoperative memory cells as appropriate following the testing stage.

Newer technologies, such as simultaneous read and write operation flash memories, present opportunities for the redesign of CAM circuitries and architectures to meet increasing standards of system performance, and device density. It would be desirable to implement a more efficient redundancy CAM circuitry and architecture in a flash memory.

DETAILED DESCRIPTION OF THE PRESENTLY PREFERRED EMBODIMENTS

Redundant core cell arrays are utilized to substitute for inoperative memory core cells of primary or regular arrays. Content addressable memory (CAM) circuitry may be utilized to assist in redundancy substitution. Redundancy CAM cells store information regarding the locations of inoperative memory cells so that redundant arrays of memory cells may be used to substitute for the inoperative memory cells of the primary arrays.

Typically, the arrays of memory cells are tested by the manufacturer for performance and accuracy prior to utilization by a customer or user. The redundancy CAM cells are erased and programmed with the locations of inoperative memory cells as appropriate following the testing stage.

Core cells in memory may be byte or word addressable. If a particular operation is to be performed at a primary array, an address for the operation is supplied. Before the memory cell location for the primary array is accessed, the address is compared with address information relating to the location of the inoperative memory cells. If the address matches a location of a group of inoperative memory cells, the address is redirected to the redundant array. The operation is then performed at the redundant array. If the address does not match a location of a group of inoperative memory cells, the address is applied to the primary array, and the operation is performed at the primary array. Typically, this substitution of primary array memory cells with redundant array memory cells is seamless and transparent to the user of the memory.

Newer technologies, such as simultaneous read and write operation flash memories, present opportunities for the redesign of CAM circuitries and architectures to meet increasing standards of system performance, and device density. The presently preferred embodiments described herein implement a more efficient redundancy CAM circuitry and architecture in a memory such as a flash memory.

A CAM cell is configured to store information regarding a location of an inoperative memory cell in a primary core cell array. Typically, the inoperative memory cell requires a substitution with a memory cell in a redundant array. The information stored in the CAM cell may also relate to whether a memory cell, as addressed by an operation address of the primary core cell array requires a substitution with a memory cell of a redundant array. Since an individual CAM cell or group of CAM cells can store information to determine whether an operation address refers to a location of an inoperative memory cell in a core cell array, and since the operation address might be used for a read or a write operation, then in general it would be expected that an individual CAM or group of CAM cells would be required to store information separately for each operation in a particular area.

With simultaneous operation, however, a read and a write operation are restricted from being performed simultaneously within the same bank. Additionally restrictive criteria on simultaneous read and write operation may apply. Therefore, according to the presently preferred embodiments, one individual dual-ported CAM cell or one group of CAM cells storing information regarding the location of an inoperative memory cell of the core cell array may be accessed during a read operation and during a write operation. Due to the restrictions on simultaneous read and write operation, the CAM cell or cells may be accessed with no concern of simultaneous access of the one individual CAM cell or one group of CAM cells. Depending on the design, the dual nature of the CAM cell can exploit simultaneous operation to improve efficiency of CAM cell layout and reduce the number of devices and peripheral circuitry.

Figure 1:
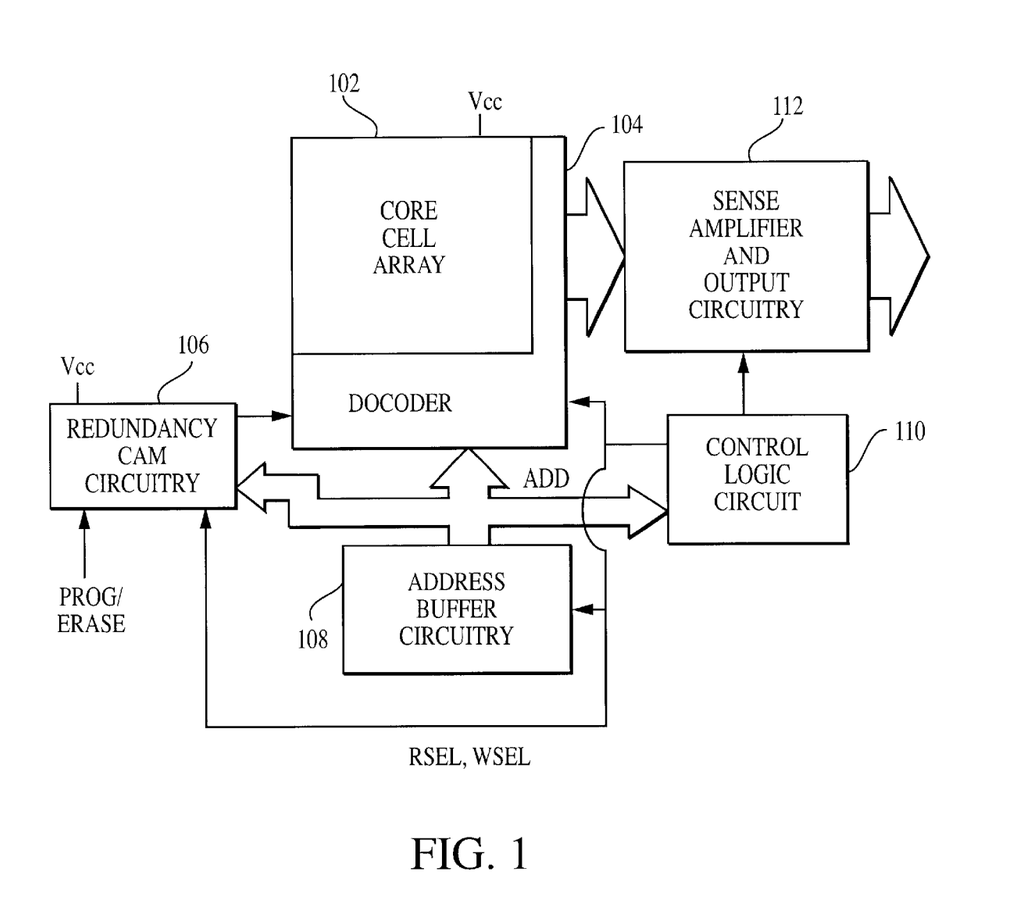
FIG. 1 is a block diagram of a memory according to a presently preferred embodiment.

Referring now to FIG. 1, it is a block diagram of a memory 100 according to a presently preferred embodiment. In the illustrated embodiment, the memory 100 is configured as a flash memory formed as a complementary metal-oxide-semiconductor (CMOS) integrated circuit for storing digital data. However, the memory 100 may take any other suitable form and in fact the principles described herein may be applied in any other suitable circuit in which simultaneous operation permits a dual-ported CAM architecture. The memory 100 includes a core cell array 102, a decoder 104, address buffer circuitry 108, redundancy CAM circuitry 106, a control logic circuit 110, and sense amplifier and output circuitry 112. The control logic circuit 110 is coupled to the decoder 104, the address buffer circuitry 108, and the sense amplifier and output circuitry 112. The control logic circuit 110 produces a series of read and write select operation signals RSEL, WSEL and distributes the signals to the decoder 104 and the redundancy CAM circuitry 106. Preferably, the control logic circuit 110 distributes timing and other control signals for the memory 100.

The core cell array 102 includes a plurality of memory cells, each configured to store data. In some applications, each memory cell may store a single bit of data; in other applications, each memory cell may store two or more bits of data. The memory cells of the core cell array 102 may be byte or word addressable and are accessed by a corresponding address at the address buffer circuitry 108. In a presently preferred embodiment, the memory cells are accessed as data words, and the addresses correspond to unique data words. In other embodiments, each memory cell has a unique address, which is decoded by the decoder 104.

Preferably, the decoder 104 includes row or x-address decoding logic and bit line or y-address decoding logic. Preferably, the x-address decoding logic of the decoder 104 responds to an address signal ADD provided from the address buffer circuitry 108 by activating one word line of a plurality of word lines, each word line being associated with one row of the core cell array 102. In response to activation of the word line, memory cells associated with that word line turn on and begin sinking current. To adequately turn on the memory cells, the word line must be varied by a substantial potential difference, such as 3.0 to 4.0 V, for example.

Preferably, the y-address decoding logic of the decoder 104 couples the appropriate bit line of the core cell array 102 to the sense amplifier and output circuitry 114. The y-address decoding logic responds to an address ADD from the address buffer circuitry 108 to decode the selected bit line from among a plurality of bit lines of the core cell array 102. The sense amplifier and output circuitry 114 senses the current in the selected memory cell of the core cell array 102 and determines the binary state of the one or more bits of data stored in the selected memory cell. The circuitry 112 produces the memory cell data that are sensed, preferably as data words, by the sense amplifier circuitry 114 at the output of the memory 100 for use external to the memory 100. Other circuitry, not shown in FIG. 1, provides for programming, reading, verifying, erasing, and performing other operations as necessary on the individual memory cells of the core cell array 102.

The memory 100 operates in response to a supply voltage, labeled $V_{CC}$ in FIG. 1. The potential difference between $V_{CC}$ and ground is the supply voltage and may be in the range 0.8 to 3.3 volts, for example. The suitability of the supply voltage $V_{CC}$ will depend on a variety of factors, including the technology with which the memory 100 is fabricated. In general, in advanced CMOS processes, the supply voltage will nominally be 1.8 volts. In absolute terms, this voltage is greater than the magnitude of the turn-on, or threshold, voltage $V_{tp}$ for p-channel transistors of −0.9 volts and the turn-on or threshold voltage $V_{tn}$ for n-channel transistors of +1.0 volts.

The core cell array 102 preferably includes a series of primary arrays and redundant arrays. The redundancy CAM circuitry 106 of FIG. 1 further includes CAM cells that store information regarding the location of an inoperative memory cell or of an inoperative bit line of one of the primary arrays of the core cell array 102. Preferably, a bit line of an associated redundant array is used as a substitute for an inoperative bit line. The CAM cells of the redundancy CAM circuitry 106 are programmed and erased at the PROG/ERASE input shown in FIG. 1. Preferably, the CAM cells are programmed and erased during a testing stage that takes place prior to use of the chip by an end-user or customer.

Preferably, whenever an operation such as a read or write is performed at the core cell array 102, the operation address is applied to the redundancy CAM circuitry 106 to compare the operation address with the information stored in the CAM cells. Preferably, if the operation address matches the location information stored in the CAM cells, then at least one of the memory cells locations to which the operation address refers is inoperative and requires a redundancy substitution.

For example, if a read operation is performed into the regular array, a read address that corresponds to a series of memory cells preferably making up a data word is compared with the information in the redundancy CAM cells. If an inoperative bit line happens to include one of the series of memory cells that the read address would access with no redundancy substitution, then the redundancy CAM circuitry will indicate a read match for the read address. Preferably, decoding logic ensures that a bit line of the redundant array is substituted for the inoperative bit line and the inoperative memory cell that the read address would access with no redundancy substitution. A similar substitution would occur if an inoperative bit line happens to include one of the series of memory cells that the write address would access with no redundancy substitution.

Figure 2:
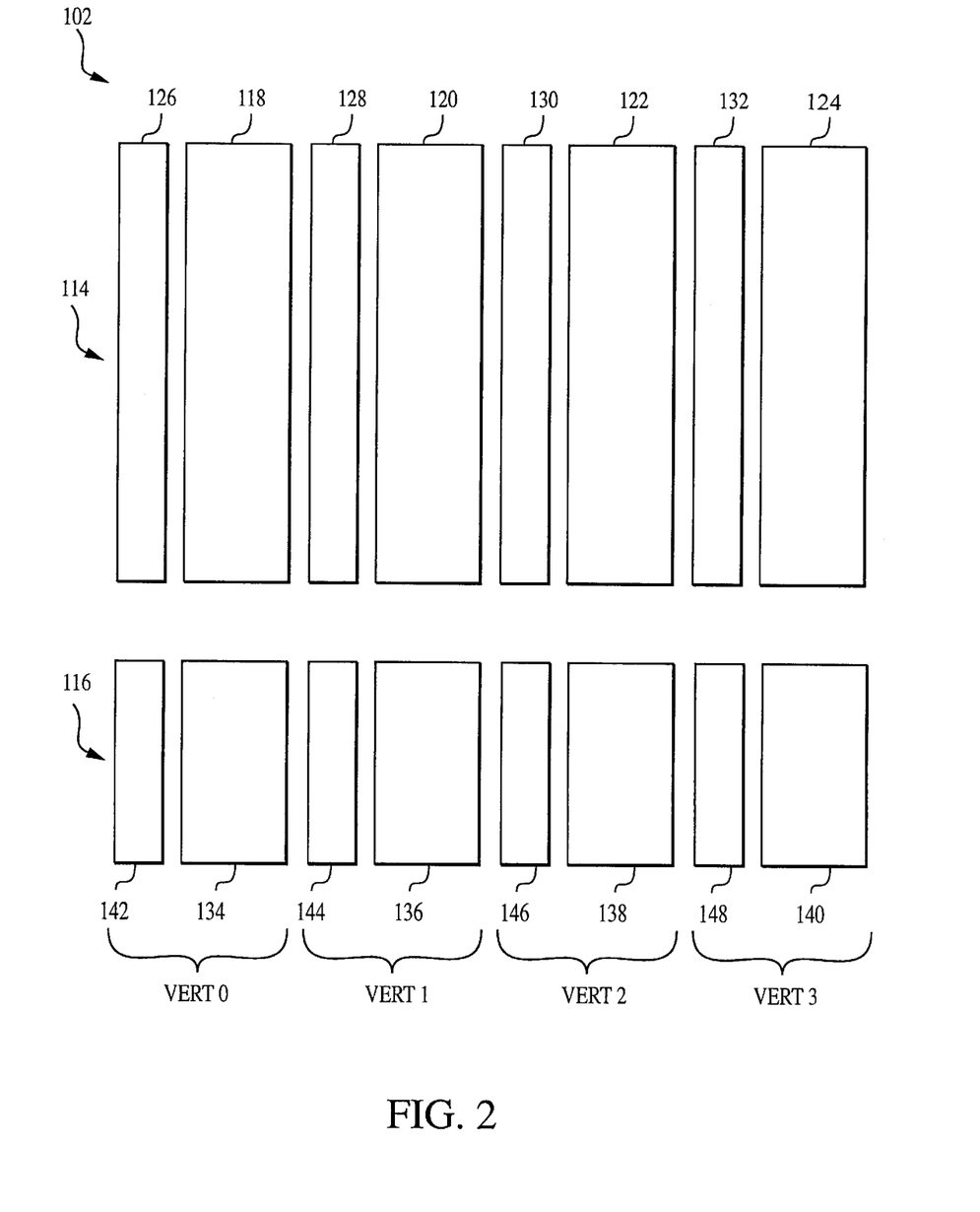
FIG. 2 is an exemplary core cell array including primary arrays and redundant arrays according to the memory of FIG. 1.

Referring now to FIG. 2, it is a diagram illustrating an exemplary core cell array 102 including primary arrays and redundant arrays according to the memory 100 of FIG. 1. Horizontally, the exemplary core cell array 102 of FIG. 2 is divided into an upper bank 114 and a lower bank 116. Vertically, the array 102 is divided into four vertical arrays VERT0, VERT1, VERT2, VERT3, each vertical array including a primary array and an associated redundant array. The upper bank 114 includes upper primary arrays 118, 120, 122, 124 and upper redundant arrays 126, 128, 130, 132. The lower bank 116 includes lower primary arrays 134, 136, 138, 140 and lower redundant arrays 142, 144, 146, 148. The vertical array VERT0 includes the primary arrays 118, 134 and the redundant arrays 126, 142. The vertical array VERT1 includes the primary arrays 120, 136 and the redundant arrays 128, 144. The vertical array VERT2 includes the primary arrays 122, 138 and the redundant arrays 130, 146. The vertical array VERT3 includes the primary arrays 124, 140 and the redundant arrays 132, 148.

Preferably, the memory 100 is a simultaneous operation memory. One of the limitations of simultaneous operation, for example, of simultaneous read and write operation, memories is that a read and a write operation may be performed simultaneously, but into different banks. Preferably, one additional limitation with respect to the core cell array 102 of FIG. 2 is that a read and a write operation may only be performed simultaneously into different banks not located within the same vertical array. That is, if a write operation is performed into the upper primary array 118 of the vertical array VERT0, then a read operation may be performed into any one of the lower primary arrays 136, 138, 140 of the vertical arrays VERT1, VERT2, VERT3, respectively. However, in this instance a read operation may not be performed into any of the upper primary arrays 118, 120, 122, 124 of the vertical arrays VERT0, VERT1, VERT2, VERT3, respectively, or into the lower primary array 134 of the vertical array VERT0.

In a presently preferred embodiment, each vertical array is divided into nine sectors of memory cells (not shown in FIG. 2). Horizontally, each sector is preferably divided into a series of column areas within the primary array. Each column area, in turn, includes a number of memory cells. Each memory cell of the column area preferably corresponds to a unique bit line for the primary array. As discussed above, in the event of an inoperative memory cell in the primary arrays, the location of the inoperative memory cell is identified. Preferably, a bit line spanning the upper and lower redundant array portions of the vertical array substitutes for the entire bit line of the primary array that corresponds to the inoperative memory cell. Preferably, if one memory cell of a bit line is inoperative, the entire bit line will be substituted for by a redundant bit line, so that an inoperative bit line by definition includes at least one inoperative memory cell. Typically, and depending on the design of the core cell array 102, a limited number of inoperative bit lines of a primary array may be substituted for with an associated redundant array.

In a presently preferred embodiment, the memory cells are accessed as data words, with a column area of memory cells storing a unique data word. For example, in one embodiment according to the memory 100, a read operation is performed where two 16 bit data words are read at a time internally while one 16 bit data word is produced at a time from the output circuitry 112. In this way, two column areas would be accessed together in a read operation. By contrast a write operation is performed with one 16 bit data word at a time, and one column area would be accessed at a time. Of course, these data word lengths are exemplary and other word lengths may be used as suitable.

Figure 3:
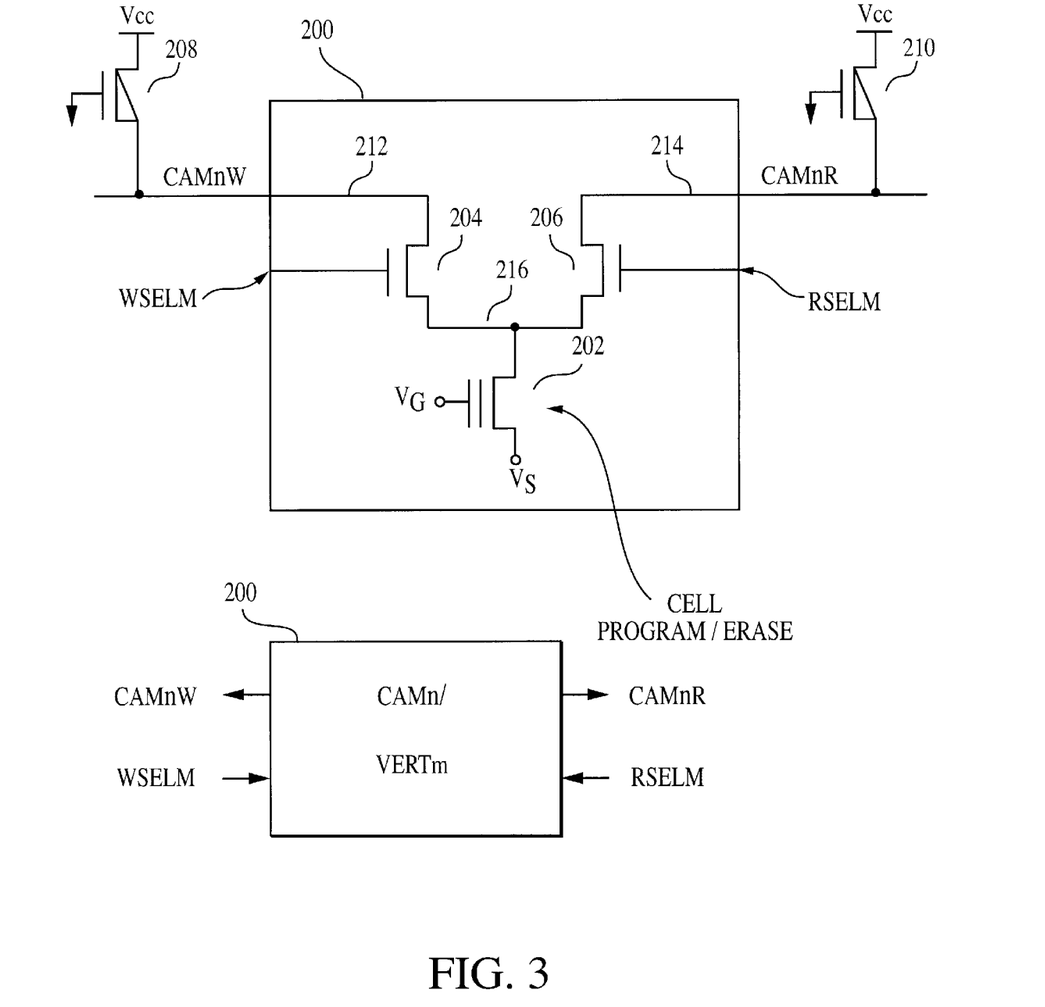
FIG. 3 is a circuit diagram of an exemplary CAM stage and accompanying output circuitry according to the memory of FIG. 1.

Referring now to FIG. 3, it is a circuit diagram of an exemplary dual-ported CAM stage 200 and accompanying output circuitry according to the memory of FIG. 1. In other embodiments, the dual-ported CAM stage 200 may be utilized without the accompanying output circuitry to indicate the necessity of redundancy substitution. The exemplary CAM stage 200 includes a dual-ported CAM cell 202, a write data bus 204, and a read data bus 206. The CAM cell 202 is a transistor, preferably an n-channel metal-oxide-semiconductor field effect transistor (MOSFET). While the CAM cell 202 is preferably a MOSFET transistor utilized as a nonvolatile memory cell, any suitable active data storage element may be used for the CAM cell 202. The write data bus 204 has an output port coupled to a node 212 and an input coupled to the drain of the CAM cell 202 at a node 216. The read data bus 206 has an output port coupled to a node 214 and an input coupled to the drain of the CAM cell 202 at the node 216. The write data bus 204 and the read data bus 206 are transistors, preferably n-channel MOSFETs. Of course, any suitable data bus may be used for the data buses 204, 206. A write select signal WSELm is applied to the gate of the write data bus 204, while a read select signal RSELm is applied to the gate of the read data bus 206. A voltage $V_G$ is applied to the gate input of the CAM cell 202, while a voltage $V_S$ is applied to the source input of the CAM cell 202. Preferably, during regular operation of the CAM cell 202, such as when the CAM cell 202 is checked or accessed, the voltage $V_S$ will be at ground potential.

A shorthand designation for the exemplary dual-ported CAM stage 200 is also presented in FIG. 3. A generic CAM stage 200 can be referred to as CAMn/VERTm, where m refers to any one of M vertical arrays VERT0, VERT1, ..., VERTM, where n refers to any one of N CAM stages 200 CAM0, CAM1, ..., CAMN associated with a vertical array VERTm. Preferably, in the exemplary core cell array 102 shown in FIG. 2, there are M=4 vertical arrays VERT0, VERT1, VERT2, VERT3. Preferably, each vertical array VERTm has N=8 associated and unique redundancy dual-ported CAM stages CAM0, CAM1, CAM2, CAM3, CAM4, CAM5, CAM6, CAM7. Of course, the core cell array 102 is scalable and may be designed, sized, arranged, or separated differently from the exemplary core cell array 102 shown in FIG. 2. The number of redundancy CAM cells 202 and stages 200 associated with each vertical may also vary depending on the embodiment and the particular design and layout of the core cell array 102. That is, more redundancy arrays may be provided or additional CAM cells may be used to particularly identify the location of an inoperative memory cell, the location of the inoperative bit line that includes the inoperative memory cell, or the column area in which the inoperative bit line is located.

Preferably, the CAM cell 202 is a non-volatile memory cell that is capable of being erased of information or of being programmed with information. If the CAM cell 202 is an n-channel MOSFET transistor, this is accomplished via modification of the threshold voltage of the transistor. The signal cell program/erase and the accompanying arrow are intended to indicate the program/erase operation performed on the CAM cell 202. The CAM cell 202 will respond differently to an applied gate voltage depending on whether the CAM cell 202 is programmed or erased.

When the CAM cell 202 is programmed, regulated voltages are preferably applied to the drain and the gate of the transistor cell 202. The regulated voltages are relatively high, compared with the supply voltage $V_{CC}$. For example, in a preferred embodiment a voltage $V_D$ of approximately 5.0 volts is applied to the drain, while a voltage $V_G$ of around 8.5 volts is applied to the gate input of transistor CAM cell 202. Regardless of the voltages utilized, the combined effect of the programming operation on the CAM cell 202 is to increase the threshold voltage higher than any applied voltage at the gate of the CAM cell 202 during regular operation of the redundancy CAM circuitry 106, that is, higher than the supply voltage $V_{CC}$.

During regular operation, once the CAM cell 202 is programmed and the drain of the cell 202 is at ground potential, when a gate voltage $V_G$, preferably the supply voltage $V_{CC}$, is applied nothing will happen, i.e. the CAM cell will not turn on or conduct.

Typically, all of the CAMs, including the dual-ported CAM cells 202 in the memory 100, are preprogrammed prior to erasure, and are erased together. The CAM cells 202 may be erased with an ultra-violet erase procedure as is known to those skilled in the art. Of course, other erase techniques may be used. The effect of the erase operation on the CAM cell 202 is to lower the threshold voltage from its value when the cell 202 is programmed to a regular value consistent with a regular transistor. Preferably, when the CAM cell 202 is erased, the threshold voltage is set so that the cell 202 will behave like an n-channel transistor, i.e., when a gate voltage $V_G$ equivalent to the supply voltage $V_{CC}$ is applied, the transistor will turn on and conduct.

Also illustrated in FIG. 3 are two p-channel bias transistors 208, 210, preferably utilized as accompanying output circuitry for the exemplary CAM stage 200. Preferably, the transistors 208, 210 are designed and sized as weak pull-up transistors relative to the CAM cell 202. The p-channel transistors 208, 210 are preferably low threshold voltage transistors in FIG. 3. In an exemplary embodiment, the transistors 208, 210 each have a nominal threshold voltage approximately in the range of −0.5 volts to −0.8 volts. A threshold voltage falling within this range is smaller than a threshold voltage of a conventional p-channel transistor, which is typically around −1.2 volts. It is well known to those skilled in the art that the threshold voltages of transistors such as MOSFETs are controlled during fabrication. The device fabrication process allows some flexibility in selecting the threshold voltage. However, normal values prevail and are in common usage for MOSFETs in particular processes. It should be understood that these threshold voltages are exemplary only. Generally, transistor design parameters, such as threshold voltages and device sizes, other circuit configurations, or other applicable design techniques available to those skilled in the art may be used or substituted where suitable.

The p-channel transistors 208, 210 may be referred to with regard to their connection with the write and read data buses 204, 206. The write p-channel bias transistor 208 is coupled to the output port of the write data bus 204 at the node 212. The generic CAM stage 200, which may be referred to as CAMn/VERTm, and the write p-channel bias transistor 208 produce a signal CAMnW at the node 212, where, as above, n refers to any one of N CAM stages 200 CAM0, CAM1, ..., CAMN associated with a vertical array VERTm. The W identifies the signal CAMnW at the node 212 as a write operation CAM signal.

Similarly, the read p-channel bias transistor 210 is coupled to the output port of the read data bus 206 at the node 214. The generic CAM stage 200, which may be referred to as CAMn/VERTm, and the read p-channel bias transistor 210 produce a signal CAMnR at the node 214, where, as above, n refers to any one of N CAM stages 200 CAM0, CAM1, ..., CAMN associated with a vertical array VERTm. The R identifies the signal CAMnR at the node 214 as a read operation CAM signal.

The gate inputs of the read and the write p-channel bias transistors 210, 208 are connected to ground potential, while the source inputs are at the supply voltage VCC. Therefore, since the transistors 210, 208 are low threshold voltage transistors as described above, the transistors 210, 208 will conduct and the respective nodes 212, 214 will be at $V_{CC}$ in the absence of pull-down action from the CAM stage 200.

The operation of the CAM stage 200 in conjunction with the transistors 208, 210 proceeds as follows. Preferably, whenever an operation to access the core cell array 102 occurs, regardless of whether the operation is a read or a write, the CAM cells 202 of the redundancy CAM circuitry 106 are accessed. A determination is made whether the address in question (a read address or a write address) includes an inoperative memory cell location where a redundancy substitution is needed. The information regarding this location was programmed into the CAM cells 202 preferably prior to the operation. Preferably, whenever a read or write operation or both occurs, the source voltage $V_S$ of every CAM cell 202 is at ground potential and the gate voltage $V_G$ of every CAM cell 202 is brought up to the supply voltage $V_{CC}$.

A CAM cell 202 will respond differently to an applied gate voltage depending on whether or not the CAM cell 202 is program or erased. If a write operation is being performed at a vertical array VERTm, then the write select signal WSELm will be high and the write data bus 204 will be on. A programmed CAM cell 202 will remain off and will not turn on or conduct in response to an applied gate voltage $V_G$, preferably the supply voltage $V_{CC}$. The write pull-up transistor 208 will conduct and the node 212 will be at $V_{CC}$ in the absence of pull-down action from the CAM stage 200. Therefore, if the CAM cell 202 is programmed and the write data bus 204 is on, the node 212 remains high or at $V_{CC}$.

If a write operation is being performed at a vertical array VERTm, then the write select signal WSELm will be high and the write data bus 204 will be on. An erased CAM cell 202 will behave like an n-channel transistor and will turn on and conduct in response to an applied gate voltage $V_G$, preferably the supply voltage $V_{CC}$. The CAM cell 202 will pull the node 216 to ground potential. Preferably, the CAM cell 202 is designed to be stronger than the write pull-up transistor 208 and therefore, if the CAM cell 202 is erased and the write data bus 204 is on, the node 212 will be pulled to ground potential.

If a write operation is not being performed at a vertical array VERTm, then the write data bus 204 will be off, and the CAM cell 202 will not be checked. Whether the CAM cell 202 is programmed or erased will not affect the value of the signal CAMnW at the node 212.

Generally, if a write operation is being performed at a vertical array VERTm, the signals CAM0W ... CAMNW will specify the location of the bit line where a redundancy substitution is to be made, if one exists and if one was programmed in the CAM stages 200 CAM0/VERTm ... CAMN/VERTm. Preferably, one or more of the signals CAM0W ... CAMNW will be compared with the write address to determine whether there is a write match. If there is a write match for an inoperative bit line, a bit line from the redundant array substitutes for the inoperative bit line. That is, the redundant bit line is utilized instead of the inoperative bit line if a match is indicated between the write address and the CAM stages 200 associated with the primary array at which the write operation otherwise occurs.

Similarly, if a read operation is being performed at a vertical array VERTm, then the read select signal RSELm will be high and the read data bus 206 will be on. A programmed CAM cell 202 will remain off and will not turn on or conduct in response to an applied gate voltage $V_G$, preferably the supply voltage $V_{CC}$. The read pull-up transistor 210 will conduct and the node 214 will be at $V_{CC}$ in the absence of pull-down action from the CAM stage 200. Therefore, if the CAM cell 202 is programmed and the read data bus 206 is on, the node 214 remains high or at $V_{CC}$.

If a read operation is being performed at a vertical array VERTm, then the read select signal RSELm will be high and the read data bus 206 will be on. An erased CAM cell 202 will behave like an n-channel transistor and will turn on and conduct in response to an applied gate voltage $V_G$, preferably the supply voltage $V_{CC}$. The CAM cell 202 will pull the node 216 to ground potential. Preferably, the CAM cell 202 is designed to be stronger than the read pull-up transistor 210 and therefore, if the CAM cell 202 is erased and the read data bus 204 is on, the node 214 will be pulled to ground potential.

If a read operation is not being performed at a vertical array VFRTm, then the read data bus 206 will be off, and the CAM cell 202 will not be checked. Whether the CAM cell 202 is programmed or erased will not affect the value of the signal CAMnR at the node 214.

Generally, if a read operation is being performed at a vertical array VERTm, the signals CAM0R . . . CAMNR will specify the location of the bit line where a redundancy substitution is to be made, if one exists and one was programmed in the CAM stages 200 CAM0/VERTm . . . CAMN/VERTm. Preferably, one or more of the signals CAM0R . . . CAMNR will be compared with the read address to determine whether there is a read match. If there is a read match for an inoperative bit line, a bit line from the redundant array substitutes for the inoperative bit line. That is, the redundant bit line is utilized instead of the inoperative bit line if a match is indicated between the read address and the CAM stages 200 associated with the primary array at which the read operation otherwise occurs.

Figure 4:
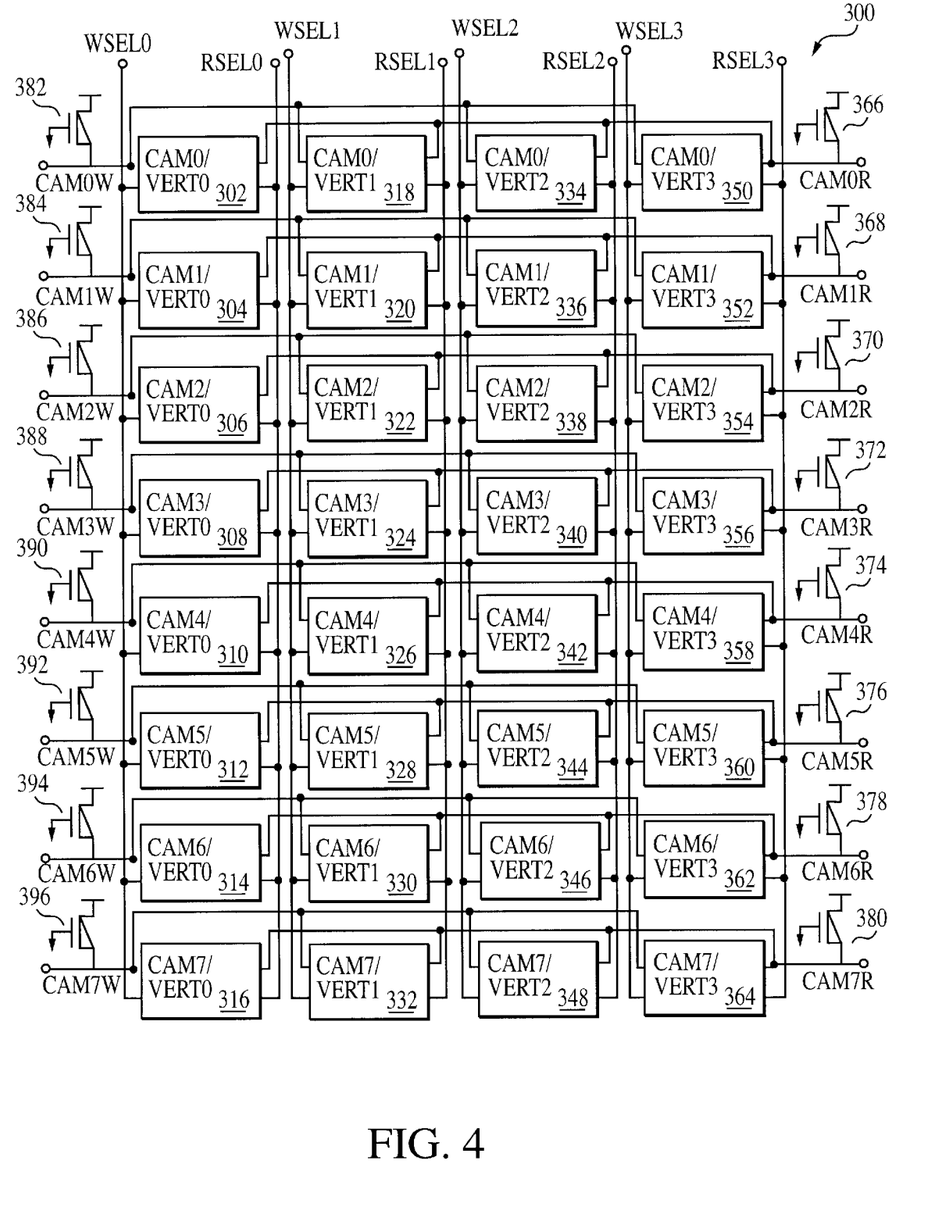
FIG. 4 is a block diagram illustrating an exemplary CAM stage array and accompanying output circuitry according to the memory of FIG. 1 and the exemplary core cell array of FIG. 2.

FIG. 4 is a block diagram illustrating an exemplary CAM stage array 300 and accompanying output circuitry according to the memory of FIG. 1 and the exemplary core cell array 102 of FIG. 2. Preferably, the redundancy CAM circuitry 106 of FIG. 1 includes the exemplary CAM stage array 300. The CAM stage array 300 includes the following CAM stages 200:

associated with the vertical array VERT0:
CAM0/VERT0 302, CAM1/VERT0 304, CAM2/VERT0 306, CAM3/VERT0 308, CAM4/VERT0 310, CAM5/VERT0 312, CAM6/VERT0 314, and CAM7/VERT0 316;

associated with the vertical array VERT1:
CAM0/VERT1 318, CAM1/VERT1 320, CAM2/VERT1 322, CAM3/VERT1 324, CAM4/VERT1 326, CAM5/VERT1 328, CAM6/VERT1 330, and CAM7/VERT1 332;

associated with the vertical array VERT2:
CAM0/VERT2 334, CAM1/VERT2 336, CAM2/VERT2 338, CAM3/VERT2 340, CAM4/VERT2 342, CAM5/VERT2 344, CAM6/VER72 346, and CAM7/VERT2 348;

associated with the vertical array VERT3:
CAM0/VERT3 350, CAM1/VERT3 352, CAM2/VERT3 354, CAM3/VERT3 356, CAM4/VERT3 358, CAM5/VERT3 360, CAM6/VERT3 362, and CAM7/VERT3 364.

The CAM stage array 300 further includes read p-channel pull-up low-threshold voltage transistors 366, 368, 370, 372, 374, 376, 378, 380, write p-channel pull-up low threshold voltage transistors 382, 384, 386, 388, 390, 392, 394, 396.

All of the CAM stages 200 of the CAM stage array 300 associated with the vertical array VERT0 receive the write and read select signals WSEL0, RSEL0. All of the CAM stages 200 of the CAM stage array 300 associated with the vertical array VERT1 receive the write and read select signals WSEL1, RSEL1. All of the CAM stages 200 of the CAM stage array 300 associated with the vertical array VERT2 receive the write and read select signals WSEL2, RSEL2. All of the CAM stages 200 of the CAM stage array 300 associated with the vertical array VERT3 receive the write and read select signals WSEL3, RSEL3.

The CAM stages CAM0/VERT0 302, CAM0/VERT1 318, CAM0/VERT2 334, and CAM0/VERT3 350 are all coupled to the read pull-up transistor 366 at a shared output having a signal CAM0R and are all coupled to the write pull-up transistor 382 at a shared output having a signal CAM0W.

The CAM stages CAM1/VERT0 304, CAM1/VERT1 320, CAM1/VERT2 336, and CAM1/VERT3 352 are all coupled to the read pull-up transistor 368 at a shared output having a signal CAM1R and are all coupled to the write pull-up transistor 384 at a shared output having a signal CAM1W.

The CAM stages CAM2/VERT0 306, CAM2/VERT1 322, CAM2/VERT2 338, and CAM2/VERT3 354 are all coupled to the read pull-up transistor 370 at a shared output having a signal CAM2R and are all coupled to the write pull-up transistor 386 at a shared output having a signal CAM2W.

The CAM stages CAM3/VERT0 308, CAM3/VERT1 324, CAM3/VERT2 340, and CAM3/VERT3 356 are all coupled to the read pull-up transistor 372 at a shared output having a signal CAM3R and are all coupled to the write pull-up transistor 388 at a shared output having a signal CAM3W.

The CAM stages CAM4/VERT0 310, CAM4/VERT1 326, CAM4/VERT2 342, and CAM4/VERT3 358 are all coupled to the read pull-up transistor 374 at a shared output having a signal CAM4R and are all coupled to the write pull-up transistor 390 at a shared output having a signal CAM4W.

The CAM stages CAM5/VERT0 312, CAM5/VERT1 328, CAM5/VERT2 344, and CAM5/VERT3 360 are all coupled to the read pull-up transistor 376 at a shared output having a signal CAM5R and are all coupled to the write pull-up transistor 392 at a shared output having a signal CAM5W.

The CAM stages CAM6/VERT0 314, CAM6/VERT1 330, CAM6/VERT2 346, and CAM6/VERT3 362 are all coupled to the read pull-up transistor 378 at a shared output having a signal CAM6R and are all coupled to the write pull-up transistor 394 at a shared output having a signal CAM6W.

The CAM stages CAM7/VERT0 316, CAM7/VERT1 332, CAM7/VERT2 348, and CAM7/VERT3 364 are all coupled to the read pull-up transistor 380 at a shared output having a signal CAM7R and are all coupled to the write pull-up transistor 396 at a shared output having a signal CAM7W.

Figure 5:
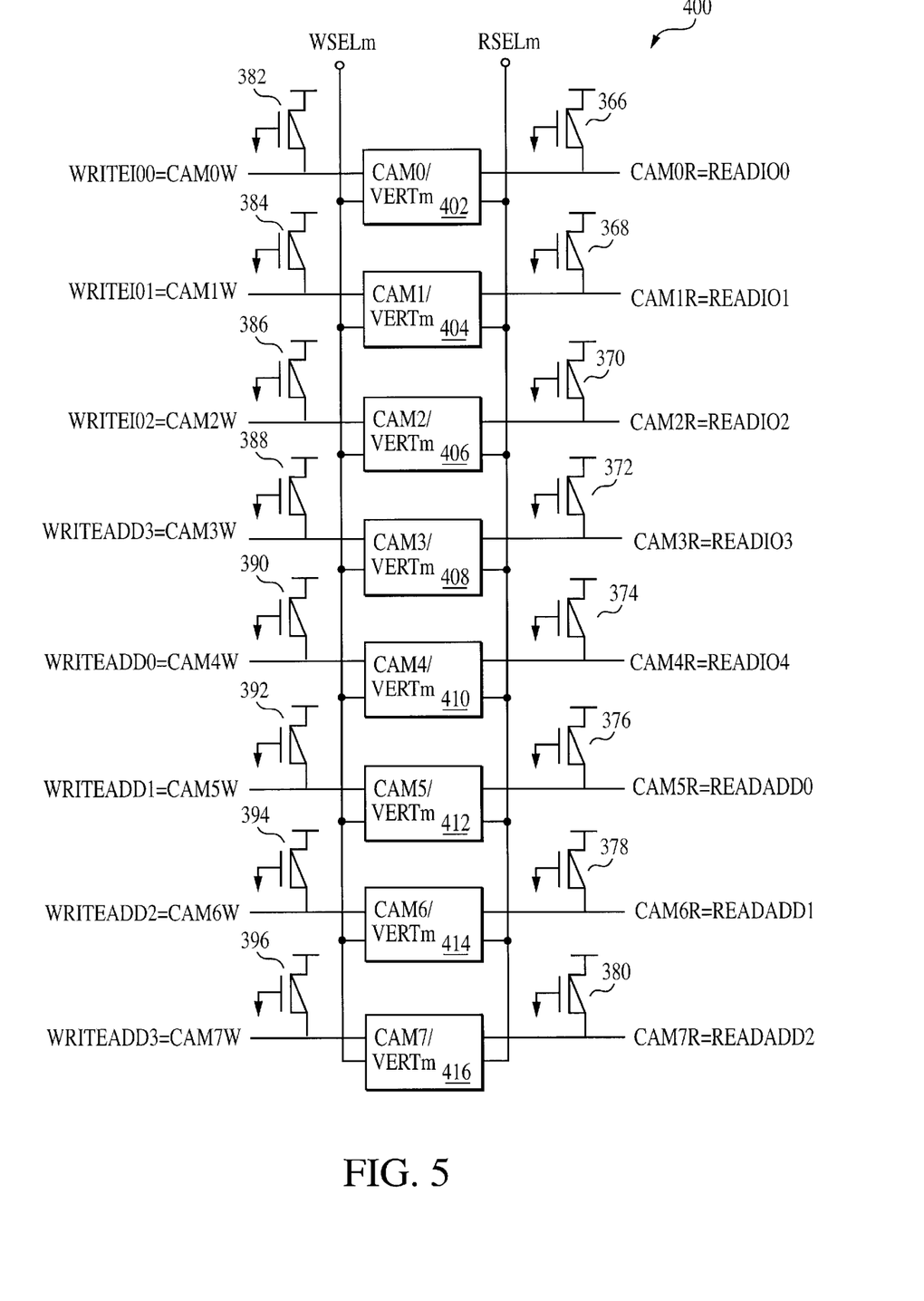
FIG. 5 is a block diagram illustrating an exemplary group of CAM stages associated with one vertical array of the exemplary core cell array of FIG. 2.

FIG. 5 is a block diagram illustrating an exemplary group 400 of CAM stages 200 associated with one vertical array VERTm of the exemplary core cell array 102 of FIG. 2. The exemplary CAM stage group 400 includes the following CAM stages 200: CAM0/VERTm 402, CAM1/VERTm 404, CAM2/VERTm 406, CAM3/VERTm 408, CAM4/VERTm 410, CAM5/VERTm 412, CAM6/VERTm 414, and CAM7/VERTm 416, all associated with a vertical array VERTm. All of the CAM stages 200 of the CAM stage group 400 receive a write select signal WSELm and a read select signal RSELm corresponding to the vertical array VERTm.

As discussed above, since the memory 100 supports simultaneous operation, the redundancy CAM circuitry 106 is preferably capable of keeping track of two separate operations taking place, such as a read operation and a write operation. In addition, in a presently preferred embodiment, the memory cells are accessed as data words, with a column area of memory cells storing a unique data word. For example, in one embodiment according to the memory 100, a read operation is performed where two 16 bit data words are read at a time internally while one 16 bit data word is produced at a time from the output circuitry 112 of FIG. 1. In this way, two column areas would be accessed together in a read operation. By contrast, a write operation is performed with one 16 bit data word at a time, and one column area would be accessed at a time. Of course, these data word lengths are exemplary and other word lengths may be used as suitable.

According to presently preferred embodiment a horizontal row in the primary array of a vertical array VERTm will include p column areas, each including q bit lines. For example, the row may include p=16 column areas with each of the 16 column areas including q=16 bit lines, for a total of 256 bit lines in a horizontal row. Of course, these values are exemplary and intended to explain rather than limit the presently preferred embodiments.

The exemplary CAM stage group 400 of eight CAM stages 402, 404, 406, 408, 410, 412, 414, 416 specifies the location of an inoperative bit line with a column area of the primary array of the vertical array VERTm. Preferably, a redundant bit line of the redundant array substitutes for the inoperative bit line that would otherwise be accessed by a write or read operation.

The location of an inoperative bit line $BL_i$ is identified first by identifying the column area of the p column areas that includes the inoperative bit line. Next, the bit line of the q bit lines of the column area that corresponds to the inoperative bit line is identified. Accordingly, the exemplary CAM stage group 400 of eight CAM stages 402, 404, 406, 408, 410, 412, 414, 416 preferably stores two pieces of information to indicate that the location of the inoperative bit line $BL_i$.

For a write operation, the f-bit ($2^f$=p) write address that corresponds to a column area having q bit lines is compared to the f-bit ($2^f$=p) address stored in a group of f address CAM stages. The column area preferably stores a data word. In particular, the f address CAM stages specify the f-bit ($2^f$=p) address of the column area that includes the inoperative bit line $BL_i$. If there is a match between the f-bit write address and the f-bit address stored in the f address CAM stages, then the location of the inoperative bit line $BL_i$ is identified by g ($2^g$=q) I/O CAM stages. The values for f and g will in general depend on the values for p and q.

For example, according to a presently preferred embodiment the write operation is performed with one 16 bit data word at a time, and one of p=16 column areas, each column area including q=16 bit lines, is accessed at a time. According to FIG. 5, f-4 ($2^4$=16) address CAM stages 410, 412, 414, 416 store the 4-bit address of a column area that includes an inoperative bit line $BL_i$, and g=4 ($2^4$=16)I/O CAM stages 402, 404, 406, 408 store the location of the inoperative bit line $BL_i$ of the 16 bit lines within the column area. When a write operation is performed the write address is compared against the write address CAM signals WRITEADD0, WRITEADD1, WRITE ADD2, and WRITE ADD3 of the address CAM stages CAM4/VERTm 410, CAM5/VERTm 412, CAM6/VERTm 414, and CAM7/VERTm 416, respectively (with address matching circuitry not illustrated in FIG. 5 or FIG. 1.). If the write address and the write address CAM signals match, the I/O CAM stages 402, 404, 406, 408 indicate which bit line of the 16 bit lines is the inoperative bit line $BL_i$.

For a read operation, the h-bit ($^h$=p/2) read address that corresponds to two column areas, having a total of 2q bit lines, is compared to the h-bit ($2^h$p/2) address stored in a group of h address CAM stages. The two column areas preferably store two data words. In particular, the h address CAM stages specify the h-bit ($2^h$=p/2) address of the two column areas, one of which includes the inoperative bit line $BL_i$. If there is a match between the h-bit read address and the h-bit address stored in the h address CAM stages, then the location of the inoperative bit line $BL_i$ is identified by j ($2^j$=2q) I/O CAM stages. The values for h and j will in general depend on the values for p and q.

For example, according to a read operation in a presently preferred embodiment two 16 bit data words are read at a time internally while one 16 bit data word is produced at a time from the output circuitry 112 of FIG. 1. In this way, two of the p=16 column areas, each column area including q=16 bit lines, are accessed at a time. According to FIG. 5, h=3 ($2^3$=8) address CAM stages 412, 414, 416 store the 3-bit address of two column areas, one of which includes include an inoperative bit line $BL_i$, and j=5 ($2^5$=32)I/O CAM stages 402, 404, 406, 408, 410 store the location of the inoperative bit line $BL_i$ of the 32 bit lines within two column areas. When a read operation is performed the read address is compared against the read address CAM signals READADD0, READADD1, and READADD2 of the address CAM stages CAM5/VERTm 412, CAM6/VERTm 414, and CAM7/VERTm 416, respectively (with address matching circuitry not illustrated in FIG. 5 or FIG. 1.). If the read address and the read address CAM signals match, the I/O CAM stages 402, 404, 406, 408, 410 indicate which bit line of the 32 bit lines of the two column areas is the inoperative bit line $BL_i$.

Even though the address CAM stages and the I/O CAM stages are used in different ways during read and write operations, the CAM stages together provide the same information regarding the location of the same inoperative bit line in a primary array that requires a substitution with a bit line in a redundant array. For example, referring to FIG. 5, assume that the output of the dual-ported CAM stages 402, 404, 406, 408, 410, 412, 414, 416 is 00010001 respectively.

If a write operation is to be performed at the column area having a write address of 0001, then these four bits are compared with the following signals:

WRITEADD3=CAM7W=0 from (address) CAM stage 416;
WRITEADD2=CAM6W=0 from (address) CAM stage 414;
WRITEADD1=CAM5W=0 from (address) CAM stage 412; and
WRITE ADD0=CAM4W=1 from (address) CAM stage 410.

There is a write address match, so the contents of the I/O CAM stages are checked to determine the location of the inoperative bit line $BL_i$ within the column area having an address of 0001, as shown by the following signals:

WRITEIO3=CAM3W=0 from (I/O) CAM stage 408;
WRITEIO2=CAM2W=0 from (I/O) CAM stage 406;
WRITEIO1=CAM1W=0 from (I/O) CAM stage 404; and
WRITEIO0=CAM0W=1 from (I/O) CAM stage 402.

If a read operation is to be performed at the two column areas together having a read address of 000, then these three bits are compared with the following signals:

READADD2=CAM7R=0 from (address) CAM stage 416;
READADD1=CAM6R=0 from (address) CAM stage 414; and READADD0=CAM5R=0 from (address) CAM stage 412.

There is a read address match, so the contents of the I/O CAM stages are checked to determine the location of the inoperative bit line BL$_i$, within the two column areas together having an address of 000, as shown by the following signals:

READIO4=CAM4R=1 from (I/O) CAM stage 410;
READIO3=CAM3R=0 from (I/O) CAM stage 408;
READIO2=CAM2R=0 from (I/O) CAM stage 406;
READIO1=CAM1R=0 from (I/O) CAM stage 404; and
READIO0=CAM0R=1 from (I/O) CAM stage 402.

Figure 6:
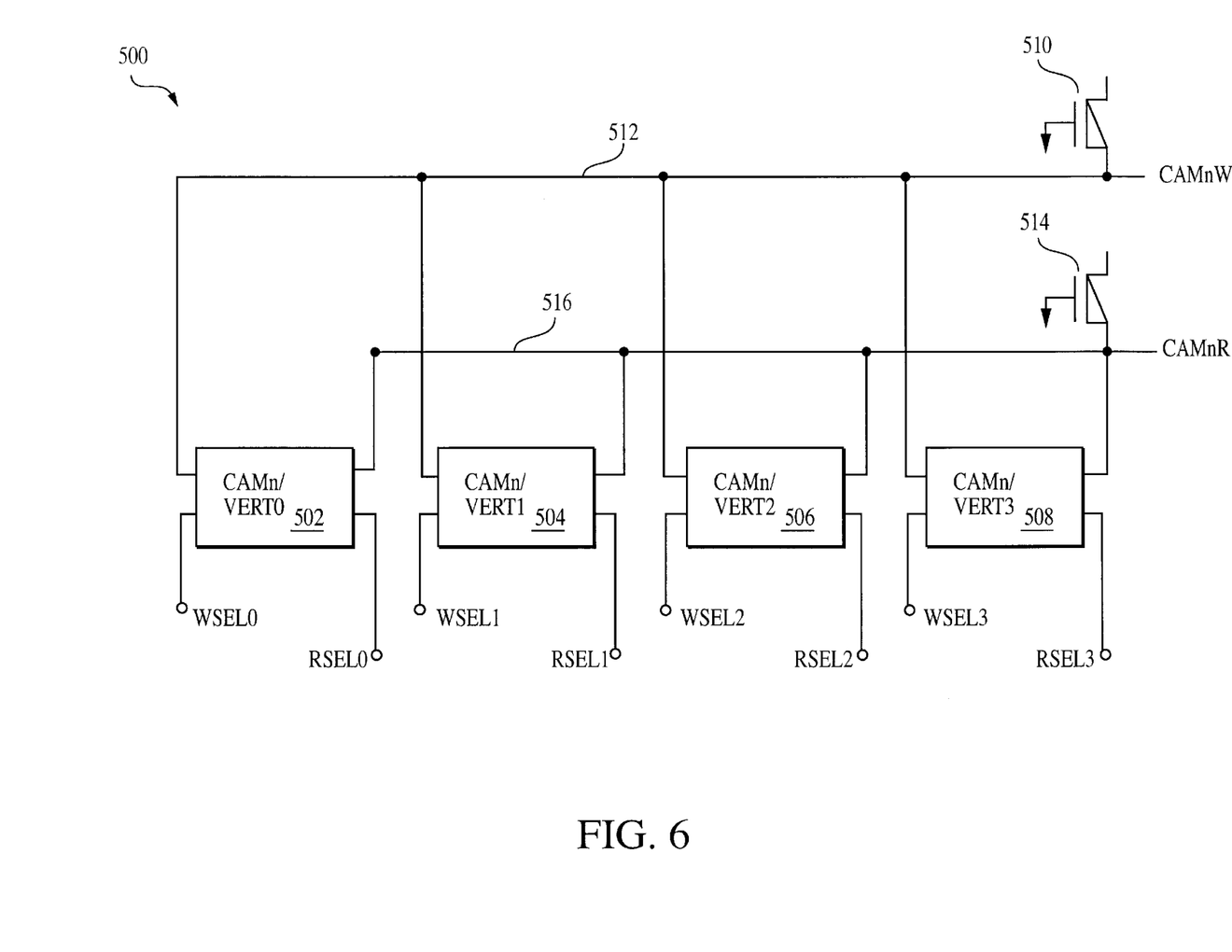
FIG. 6 is a circuit diagram of an exemplary group of CAM stages with shared output circuitry according to the memory of FIG. 2.

FIG. 6 is a circuit diagram of an exemplary group 500 of CAM stages 200 with shared output circuitry according to the memory of FIG. 2. The exemplary CAM stage group 500 includes the following CAM stages 200: CAMn/VERT0 502, CAMn/VERT1 504, CAMn/VERT2 506, and CAMn/VERT3 508. The CAM stage CAMn/VERT0 502 receives the write and read select signals WSEL0 and RSEL0 for VERT0. The CAM stage CAMn/VERT1 504 receives the write and read select signals WSEL1 and RSEL1 for VERT1. The CAM stage CAMn/VERT2 506 receives the write and read select signals WSEL2 and RSEL2 for VERT2. The CAM stage CAMn/VERT3 508 receives the write and read select signals WSEL3 and RSEL3 for VERT3. A CAM stage 200 CAMn is located at each vertical array and each CAMn 502, 504, 506, 508 stores a respective bit of information regarding the location of an inoperative bit line within each respective primary array.

As illustrated in FIG. 6, the CAMn stages 502, 504, 506, 508 are all coupled to a write pull-up transistor 510, preferably a p-channel transistor, at a shared output 512 having a signal CAMnW and are all coupled to a read pull-up transistor 514, preferably a p-channel transistor, at a shared output 516 having a signal CAMnR.

When a write operation is performed at VERT0, for example, the write select signal WSEL0 will be active and the contents of the CAM cell within the dual-ported CAM stage CAMn/VERT0 502 will be checked. Since a read operation may not be performed at VERT0 while a write operation is being performed there, the read select signal RSEL0 will not be active. In addition, the other write select signals WSEL1, WSEL2, and WSEL3 will not be active, and the signal CAMnW at the shared output 512 will be low or high depending on the contents of the CAM cell within CAMn/VERT0 502.

Similarly, when a read operation is performed at VERT2, for example, the write select signal RSEL2 will be active and the contents of the CAM cell within the dual-ported CAM stage CAMn/VERT2 506 will be checked. Since a write operation may not be performed at VERT2 while a read operation is being performed there, the write select signal WSEL2 will not be active. In addition, the other read select signals RSEL0, RSEL1, and RSEL3 will not be active, and the signal CAMnR at the shared output 516 will be low or high depending on the contents of the CAM cell within CAMn/VERT2 506.

In one embodiment, all of the components of FIG. 1 are contained on a single integrated circuit chip. Note that address and control inputs for the exemplary flash memory chips are dependent on memory density and interface implementations. It will be appreciated that the disclosed embodiments can work with different memory densities and alternate interface implementations with their accompanying alternate address and control input configurations.

As used herein, the term address is intended broadly to refer to any location identifier that uniquely corresponds to, or to the location of, one or more memory cells. The presently preferred embodiments described herein present a redundancy CAM circuitry including dual-ported CAM stages. However, aspects of the embodiments can be applied with respect to operations other than redundancy substitutions of inoperative memory cells.

As used herein, the terms and phrases low, logic low, not asserted, not active, and inactive are intended broadly to refer to logic low values of a digital signal, generally understood to represent a binary zero (0).

As used herein, the terms and phrases high, logic high, asserted, and active are intended broadly to refer to logic high values of a digital signal, generally understood to represent a binary one (1).

As used herein, the phrase "A coupled with B" is defined to mean A directly connected to B, or A indirectly connected with B through one or more intermediate components.

As used herein, the term user is intended to refer to a processor or other component or entity seeking access to memory.

As used herein, the term inoperative, when used in conjunction with a storage element or a group of storage elements, refers broadly to any condition or state that may require the substitution of one more storage elements for the inoperative storage element. The storage element may include one or more memory cells, or bit lines, or interface circuitry to memory cells, for example. In particular, as used herein, an inoperative memory cell refers broadly to a memory cell with or without accompanying circuitry, such as a bit line that is coupled to the memory cell, or a bit line that includes the memory cell. Typically, a lack of functionality of the storage element will require a substitution for the storage element. The lack of functionality may be due to damage or to a defect in the storage element or in an interface to the storage element.

It should be understood that, as used herein, the term signal refers broadly to an analog or digital signal and encompasses both types of signals.

From the foregoing, it can be seen that the presently preferred embodiments provide a memory capable of substituting a second memory cell for an inoperative memory cell. The memory includes a primary array of memory cells, a redundant array of memory cells, and redundancy content addressable memory (CAM) circuitry. The redundancy CAM circuitry includes a plurality of dual-ported CAM stages. Each CAM stage includes a CAM cell, a write data bus coupled to the CAM cell, and a read data bus coupled to the CAM cell. The CAM cell stores information regarding a location of an inoperative memory cell in the primary array. Preferably, the inoperative memory cell requires a substitution with a second memory cell in the redundant array. The write data bus produces the information from the CAM cell responsively to a write select signal. The write select signal is indicative of a write operation to be performed at memory cell locations in the primary array. The read data bus produces the information from the CAM cell responsively to a read select signal. The read select signal is indicative of a read operation to be performed at memory cell locations in the primary array.

Preferably, the write operation and the read operation are performed at different times at memory cell locations in the primary array.

Preferably, the memory is capable of comparing an operation address that refers to a location of a third memory cell in the primary array with the information of the CAM cell to determine whether the third memory cell in the primary array requires a substitution with the second memory cell in the redundant array.

In a preferred embodiment the dual-ported CAM stage includes the dual-ported CAM stage 200 of FIG. 2. Of course, other dual-ported CAM stages according to the presently preferred embodiments may be used other than the exemplary CAM stage 200 as suitable.

In addition, the presently preferred embodiments provide a dual-ported content addressable memory (CAM) stage in a memory. The CAM stage includes a CAM cell, a write data bus coupled to the CAM cell, and a read data bus coupled to the CAM cell. The CAM cell stores information regarding the location of an inoperative memory cell in a primary array of the memory. Preferably, the inoperative memory cell requires a substitution with a second memory cell in a redundant array of the memory. The write data bus produces the information from the CAM cell responsively to a write select signal. The write select signal is indicative of a write operation to be performed at memory cell locations in the primary array. The read data bus produces the information from the CAM cell responsively to a read select signal. The read select signal is indicative of a read operation to be performed at memory cell locations in the primary array.

Preferably, the write operation and the read operation are performed at different times at memory cell locations in the primary array.

Preferably, the memory is capable of comparing an operation address that refers to a location of a third memory cell in the primary array with the information of the CAM cell to determine whether the third memory cell in the primary array requires a substitution with the second memory cell in the redundant array.

In a preferred embodiment the dual-ported CAM stage includes the dual-ported CAM stage 200 of FIG. 2. Of course, other dual-ported CAM stages according to the presently preferred embodiments may be used other than the exemplary CAM stage 200 as suitable.

Further, the presently preferred embodiments provide a memory capable of substituting a second memory cell for a first memory cell. The memory includes a memory cell array, one or more redundant arrays of memory cells, and a CAM cell. The memory cell array is capable of being operated on by a first task and a second task. In other embodiments, the memory cell array includes the one or more redundant arrays of memory cells. The tasks are optionally performed concurrently with one another. The memory cell array includes a first primary array of memory cells, and a second primary array of memory cells. If the first task is performed at the first primary array, the second task cannot be performed concurrently at the first primary array. If the second task is performed at the second primary array, the first task cannot be performed concurrently at the second primary array. The CAM cell stores information regarding whether a first memory cell of the memory cell array requires a substitution with a second memory cell of one of the one or more redundant arrays. The CAM cell is capable of being accessed during the first task and during the second task.

Preferably, the CAM cell stores the location of an inoperative memory cell of the memory cell array. Preferably, the inoperative memory cell requires a substitution with the second memory cell of the one or more redundant arrays.

In addition, the presently preferred embodiments provide a memory capable of substituting a third memory cell for a first memory cell, and capable of substituting a fourth memory cell for a second memory cell. The memory includes a first primary array of memory cells, a first redundant array of memory cells associated with the first primary array of memory cells, a second primary array of memory cells, a second redundant array of memory cells associated with the first primary array of memory cells, and redundancy content addressable memory (CAM) circuitry. The first primary array includes a first memory cell, and the second primary array includes a second memory cell. The redundancy CAM circuitry includes a first group of dual-ported CAM stages and a second group of dual-ported CAM stages. The first group of dual-ported CAM stages stores first location information of the first memory cell. Preferably, the first memory cell requires a substitution with a third memory cell in the first redundant array. For example, the first memory cell may be damaged, or may be otherwise inoperative. The second group of dual-ported CAM stages stores second location information of the second memory cell. Preferably, the second memory cell requires a substitution with a fourth memory cell in the second redundant array. For example, the second memory cell may be damaged, or may be otherwise inoperative. A first initial CAM stage of the first group of CAM stages includes a first CAM cell, a first write data bus, and a first read data bus. The first write data bus and the first read data bus are respectively coupled to the CAM cell. A second initial CAM stage of the second group of CAM stages includes a second CAM cell, a second write data bus, and a second read data bus. The second write data bus and the second read data bus are respectively coupled to the CAM cell. The second write data bus and the first write data bus share a first write output. The second read data bus and the first read data bus share a first read output.

Preferably, the first write data bus produces a first portion of the first location information from the first group of CAM stages at the first write output responsively to a first write select signal. Preferably, the first portion of the first location information includes one bit of information. The first write select signal is indicative of a write operation to be performed on memory cell locations in the first primary array. Preferably, the second write data bus produces a second portion of the second location information from the second group of CAM stages at the first write output responsively to a second write select signal. Preferably, the second portion of the second location information includes one bit of information. The second write select signal is indicative of a write operation to be in performed on memory cell locations in the second primary array. Preferably, the memory further includes a write bias transistor coupled to the first write output to bias the first write output to a first value. Preferably, if a write operation is performed at the first primary array and the first write output is pulled to a second value, the first CAM cell is erased. Preferably, if a write operation is performed at the first primary array and the first write output remains at the first value, the first CAM cell is programmed. Preferably, if a write operation is performed at the second primary array and the first write output is pulled to the second value, the second CAM cell is erased. Preferably, if a write operation is performed at the second primary array and the first write output remains at the first value, the second CAM cell is programmed.

Preferably, the first read data bus produces a first portion of the first location information from the first group of CAM stages at the first read output responsively to a first read select signal. Preferably, the first portion of the first location information includes one bit of information. The first read select signal is indicative of a read operation to be performed on memory cell locations in the first primary array. Preferably, the second read data bus produces a second portion of the second location information from the second group of CAM stages at the first read output responsively to a second read select signals. Preferably, the second portion of the second location information includes one bit of information. The second read select signal is indicative of a read operation to be performed on memory cell locations in the second primary array. Preferably, the memory further includes a read bias transistor coupled to the first read output to bias the first read output to a first value. Preferably, if a read operation is performed at the first primary array and the first read output is pulled to a second value, the first CAM cell is erased. Preferably, if a read operation is performed at the first primary array and the first read output remains at the first value, the first CAM cell is programmed. Preferably, if a read operation is performed at the second primary array and the first read output is pulled to the second value, the second CAM cell is erased. Preferably, if a read operation is performed at the second primary array and the first read output remains at the first value, the second CAM cell is programmed.

Further, the presently preferred embodiments provide a method of substituting a second memory cell in a redundant array of memory cells for an inoperative memory cell in a primary array of memory cells. Information is stored in a series of dual-ported CAM stages. The information is regarding a location of the inoperative memory cell. An operation address, corresponding to one or more location of memory cells in the primary array, is compared with the information in the series of dual-ported CAM stages to determine whether the one or more locations of memory cells comprise the location of the inoperative memory cell. If the one or more locations of memory cells include the location of the inoperative memory cell, then the location of the second memory cell is accessed with the operation address. If the one or more locations of memory cells do not include the location of the inoperative memory cell, the one or more locations of memory cells are accessed with the operation address. In one preferred embodiment the operation address is a write address. In one preferred embodiment the operation address is a read address.

It should be understood that the steps of the methods recited herein can be performed in any order consistent with the recited acts.

While particular embodiments of the present invention have been shown and described, modifications may be made. For example, the senses of the individual transistors, p-channel and n-channel, may be reversed in suitable applications. It is to be noted that suitable transistor sizes specifying channel width to length ratios (measured in micrometers or microns) for the transistors that make up the depicted circuits have been omitted from the figures. It will be appreciated that suitable ratios may be chosen depending on the design requirements and the capabilities and limitations of the particular integrated circuit fabrication process used for implementation of the circuit as well as the performance requirements of the specific embodiment. Further, the inventive concepts described herein may be applied to circuits other than memory devices.

The foregoing detailed description has described only a few of the many forms that this invention can take. It is therefore intended that the foregoing detailed description be regarded as illustrative rather than limiting, and that it be understood that it is the following claims, including all equivalents, which are intended to define the spirit and scope of this invention. It is therefore intended in the appended claims to cover all such changes and modifications which fall within the true spirit and scope of the invention.

We claim:

1. A memory capable of substituting a second memory cell for an inoperative memory cell, the memory comprising:
    a primary array of memory cells;
    a redundant array of memory cells; and
    redundancy content addressable memory (CAM) circuitry, the circuitry comprising a plurality of dual-ported CAM stages, each CAM stage comprising:
        a CAM cell to store information regarding a location of an inoperative memory cell in the primary array, the inoperative memory cell requiring a substitution with a second memory cell in the redundant array;
        a write data bus, coupled to the CAM cell, to produce the information from the CAM cell responsively to a write select signal, the write select signal indicative of a write operation to be performed at memory cell locations in the primary array; and
        a read data bus, coupled to the CAM cell, to produce the information from the CAM cell responsively to a read select signal, the read select signal indicative of a read operation to be performed at memory cell locations in the primary array.

2. The memory of claim 1, wherein the write operation and the read operation are performed at different times at memory cell locations in the primary array.

3. The memory of claim 1, wherein the memory is capable of comparing an operation address that refers to a location of a third memory cell in the primary array with the information of the CAM cell to determine whether the third memory cell in the primary array requires a substitution with the second memory cell in the redundant array.

4. A dual-ported content addressable memory (CAM) stage in a memory, the CAM stage comprising:
    a CAM cell to store information regarding the location of an inoperative memory cell in a primary array of the memory, the inoperative memory cell requiring a substitution with a second memory cell in a redundant array of the memory;
    a write data bus, coupled to the CAM cell, to produce the information from the CAM cell responsively to a write select signal, the write select signal indicative of a write operation to be performed at memory cell locations in the primary array; and
    a read data bus, coupled to the CAM cell, to produce the information from the CAM cell responsively to a read select signal, the read select signal indicative of a read operation to be performed at memory cell locations in the primary array.

5. The dual-ported CAM stage of claim 4, wherein the write operation and the read operation are performed at different times at memory cell locations in the primary array.

6. The memory of claim 4, wherein the memory is capable of comparing an operation address that refers to a location of a third memory cell in the primary array with the information of the CAM cell to determine whether the third memory cell in the primary array requires a substitution with the second memory cell in the redundant array.

7. A memory capable of substituting a second memory cell for a first memory cell, the memory comprising:
    a memory cell array, wherein the memory cell array is capable of being operated on by a first task and a second task, the tasks optionally performed concurrently with one another, and wherein the memory cell array comprises:
        a first primary array of memory cells, wherein if the first task is performed at the first primary array, the second task cannot be performed concurrently at the first primary array;
        a second primary array of memory cells, wherein if the second task is performed at the second primary array, the first task cannot be performed concurrently at the second primary array,
    one or more redundant arrays of memory cells; and
    a CAM cell to store information regarding whether a first memory cell of the memory cell array requires a substitution with a second memory cell of one of the one or more redundant arrays, the CAM cell capable of being accessed during the first task and during the second task.

8. The memory of claim 7, wherein the CAM cell stores the location of an inoperative memory cell of the memory cell array, the inoperative memory cell requiring a substitution with the second memory cell of the one or more redundant arrays.

9. A memory capable of substituting a third memory cell for a first memory cell, and capable of substituting a fourth memory cell for a second memory cell, the memory comprising:

a first primary array of memory cells including a first memory cell;

a first redundant array of memory cells associated with the first primary array of memory cells;

a second primary array of memory cells including a second memory cell;

a second redundant array of memory cells associated with the second primary array of memory cells; and redundancy content addressable memory (CAM) circuitry, the circuitry comprising:

a first group of dual-ported CAM stages to store first location information of the first memory cell, the first memory cell requiring a substitution with a third memory cell in the first redundant array, a first initial CAM stage of the first group of CAM stages comprising:

a first CAM cell, a first write data bus, and a first read data bus, the first write data bus and the first read data bus respectively coupled to the CAM cell; and a second group of dual-ported CAM stages to store second location information of the second memory cell, the second memory cell requiring a substitution with a fourth memory cell in the second redundant array, a second initial CAM stage of the second group of CAM stages comprising:

a second CAM cell, a second write data bus, and a second read data bus, the second write data bus and the second read data bus respectively coupled to the CAM cell, the second write data bus and the first write data bus sharing a first write output, and the second read data bus and the first read data bus share a first read output.

10. The memory of claim 9, wherein the first memory cell is inoperative.

11. The memory of claim 9, wherein the second memory cell is inoperative.

12. The memory of claim 9, wherein the first write data bus produces a first portion of the first location information from the first group of CAM stages and the second write data bus produces a second portion of the second location information from the second group of CAM stages, at the first write output, responsively to respective first and second write select signals, the first and second write select signals being indicative of a write operation to be performed on memory cell locations in the first and the second primary arrays, respectively.

13. The memory of claim 12, wherein the first portion of the first location information comprises one bit of information.

14. The memory of claim 12, wherein the second portion of the second location information comprises one bit of information.

15. The memory of claim 12, further comprising:

a write bias transistor coupled to the first write output to bias the first write output to a first value.

16. The memory of claim 15, wherein if a write operation is performed at the first primary array and the first write output is pulled to a second value, the first CAM cell is erased.

17. The memory of claim 15, wherein if a write operation is performed at the first primary array and the first write output remains at the first value, the first CAM cell is programmed.

18. The memory of claim 15, wherein if a write operation is performed at the second primary array and the first write output is pulled to the second value, the second CAM cell is erased.

19. The memory of claim 15, wherein if a write operation is performed at the second primary array and the first write output remains at the first value, the second CAM cell is programmed.

20. The memory of claim 9, wherein the first read data bus produces a first portion of the first location information from the first group of CAM stages and the second read data bus produces a second portion of the second location information from the second group of CAM stages, at the first read output, responsively to respective first and second read select signals, the first and second read select signals being indicative of a read operation to be performed on memory cell locations in the first and the second primary arrays, respectively.

21. The memory of claim 20, wherein the first portion of the first location information comprises one bit of information.

22. The memory of claim 20, wherein the second portion of the second location information comprises one bit of information.

23. The memory of claim 20, further comprising:

a read bias transistor coupled to the first read output to bias the first read output to a first value.

24. The memory of claim 23, wherein if a read operation is performed at the first primary array and the first read output is pulled to a second value, the first CAM cell is erased.

25. The memory of claim 23, wherein if a read operation is performed at the first primary array and the first read output remains at the first value, the first CAM cell is programmed.

26. The memory of claim 23, wherein if a read operation is performed at the second primary array and the first read output is pulled to the second value, the second CAM cell is erased.

27. The memory of claim 23, wherein if a read operation is performed at the second primary array and the first read output remains at the first value, the second CAM cell is programmed.

28. In a memory, a method of substituting a second memory cell in a redundant array of memory cells for an inoperative memory cell in a primary array of memory cells, the method comprising:

storing information in a series of dual-ported CAM stages, the information regarding a location of the inoperative memory cell;

comparing an operation address, the operation address corresponding to one or more locations of memory cells in the primary array, with the information in the series of dual-ported CAM stages to determine whether the one or more locations of memory cells include the location of the inoperative memory cell;

if the one or more locations of memory cells include the location of the inoperative memory cell, then accessing the location of the second memory cell with the operation address; and if the one or more locations of memory cells do not include the location of the inoperative memory cell, then accessing the one or more locations of memory cells with the operation address.

29. The method of claim 28, wherein the operation address is a write address.

30. The method of claim 28, wherein the operation address is a read address.

* * * * *